United States Patent [19]
Reohr et al.

[11] Patent Number: 5,783,949
[45] Date of Patent: Jul. 21, 1998

[54] PRECHARGED BIT DECODER AND SENSE AMPLIFIER WITH INTEGRATED LATCH USABLE IN PIPELINED MEMORIES

[75] Inventors: William Robert Reohr, Pleasantville; Yuen Hung Chan, Poughkeepsie; Pong-Fei Lu, Yorktown Heights, all of N.Y.

[73] Assignee: International Business Machines Corporation, Armonk, N.Y.

[21] Appl. No.: 518,414

[22] Filed: Aug. 24, 1995

Related U.S. Application Data

[62] Division of Ser. No. 372,523, Jan. 13, 1995, which is a division of Ser. No. 279,366, Jul. 22, 1994.

[51] Int. Cl.$^6$ ............................................. H03R 19/0944
[52] U.S. Cl. .................... 326/106; 326/105; 365/230.06
[58] Field of Search ............................ 326/105–106, 326/108, 57, 98; 365/230.02, 230.06

[56] References Cited

U.S. PATENT DOCUMENTS

| | | |
|---|---|---|
| Re. 34,026 | 8/1992 | Duvvury et al. . |
| 3,983,412 | 9/1976 | Roberts et al. . |
| 4,045,785 | 8/1977 | Kirkpatrick, Jr. . |
| 4,253,163 | 2/1981 | Komoriya et al. . |
| 4,567,581 | 1/1986 | Dumbri et al. ............... 365/230.02 |
| 4,651,030 | 3/1987 | Mimoto ............................. 326/106 |
| 4,843,264 | 6/1989 | Galbraith . |
| 5,034,636 | 7/1991 | Reis et al. . |
| 5,204,560 | 4/1993 | Bredin et al. . |
| 5,247,479 | 9/1993 | Young . |
| 5,262,687 | 11/1993 | Benhamida ................. 326/106 X |
| 5,351,217 | 9/1994 | Jeon ............................ 326/106 X |
| 5,400,283 | 3/1995 | Raad ....................... 365/230.06 X |
| 5,414,659 | 5/1995 | Ito ............................ 326/106 X |

*Primary Examiner*—David R. Hudspeth
*Attorney, Agent, or Firm*—Lynn L. Augspurger; Marshall M. Curtis

[57] ABSTRACT

A memory and sense amplifier with latched output included therein derives high speed and noise immunity with precharged logic circuits through the separation of sense amplifier enablement and resetting by use of the precharge operation. Inclusion of bit line decoders which are wholly or partially self-resetting and self-precharging in sense amplifier support circuitry allows high performance at extremely short memory operation cycle times. A multiplexor is included which is usable in operating cycles as well as test cycles of the memory and further, in combination with other elements of the memory and sense amplifier arrangement, enables the pipelining of plural memory operations in a single memory cycle.

7 Claims, 13 Drawing Sheets

BIT DECODER FOR SINGLE CYCLE READ AND WRITE

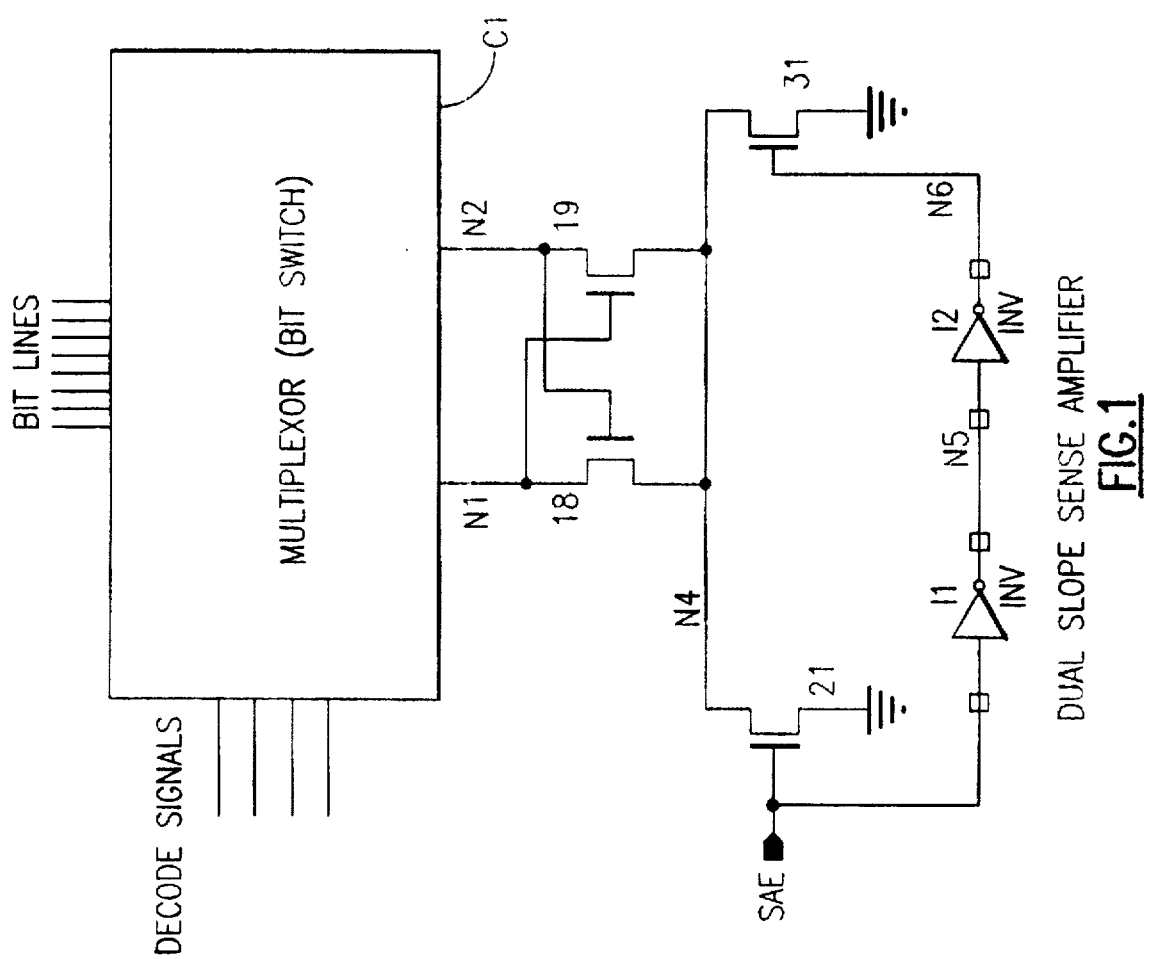

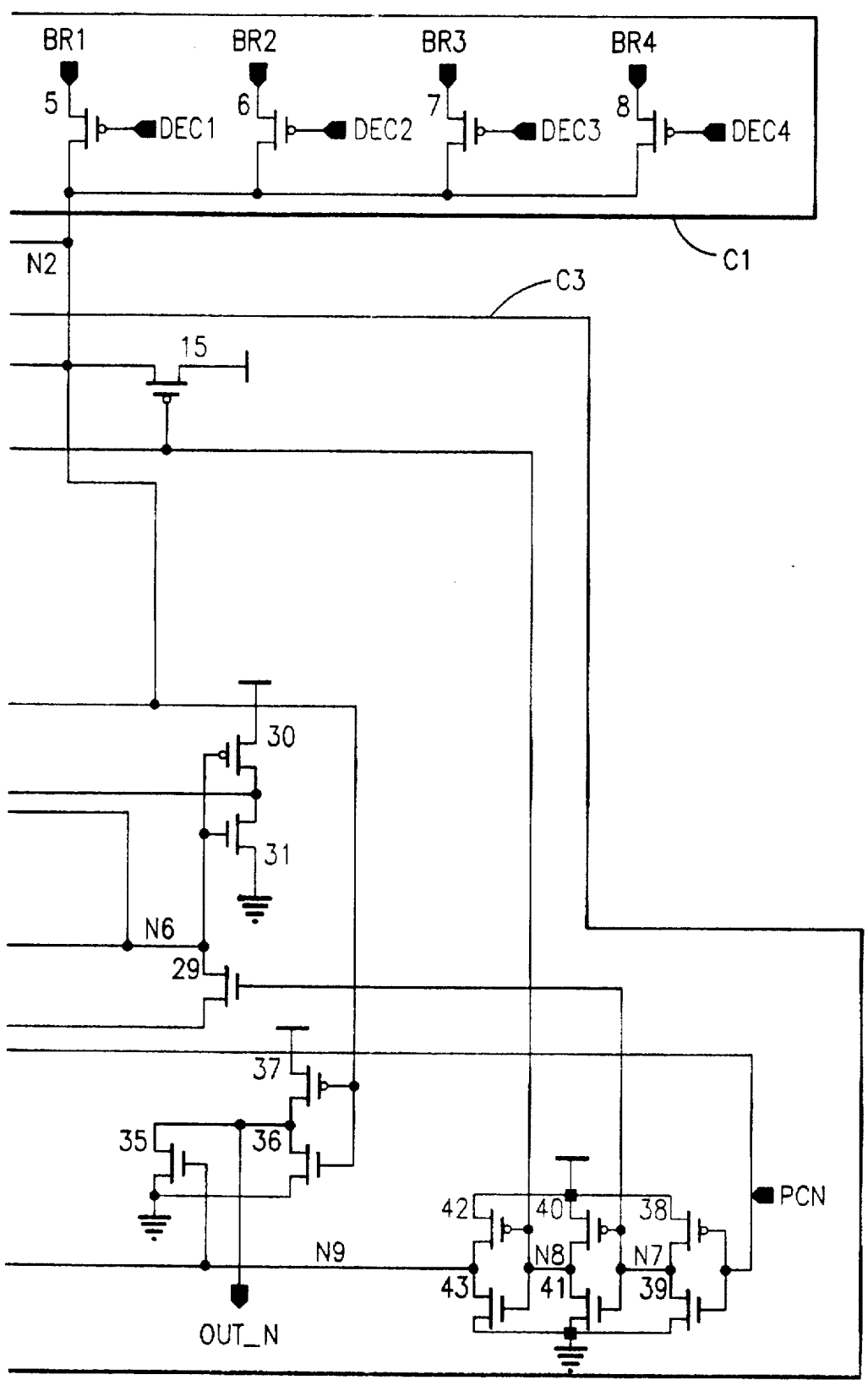
FIG.4B  CORE SENSE AMPLIFIER CIRCUIT

SENSE AMPLIFIER SUPPORT CIRCUITRY

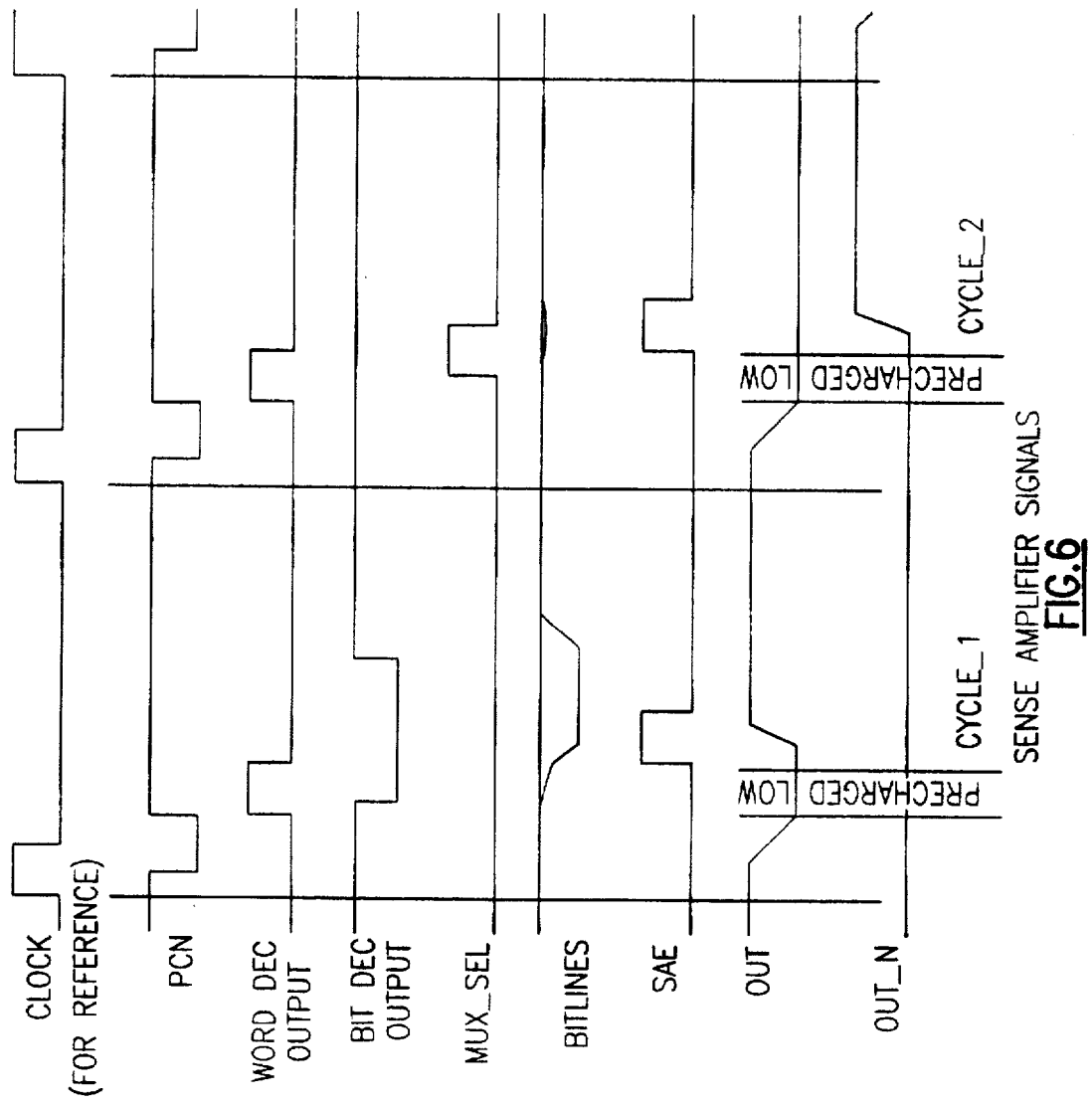

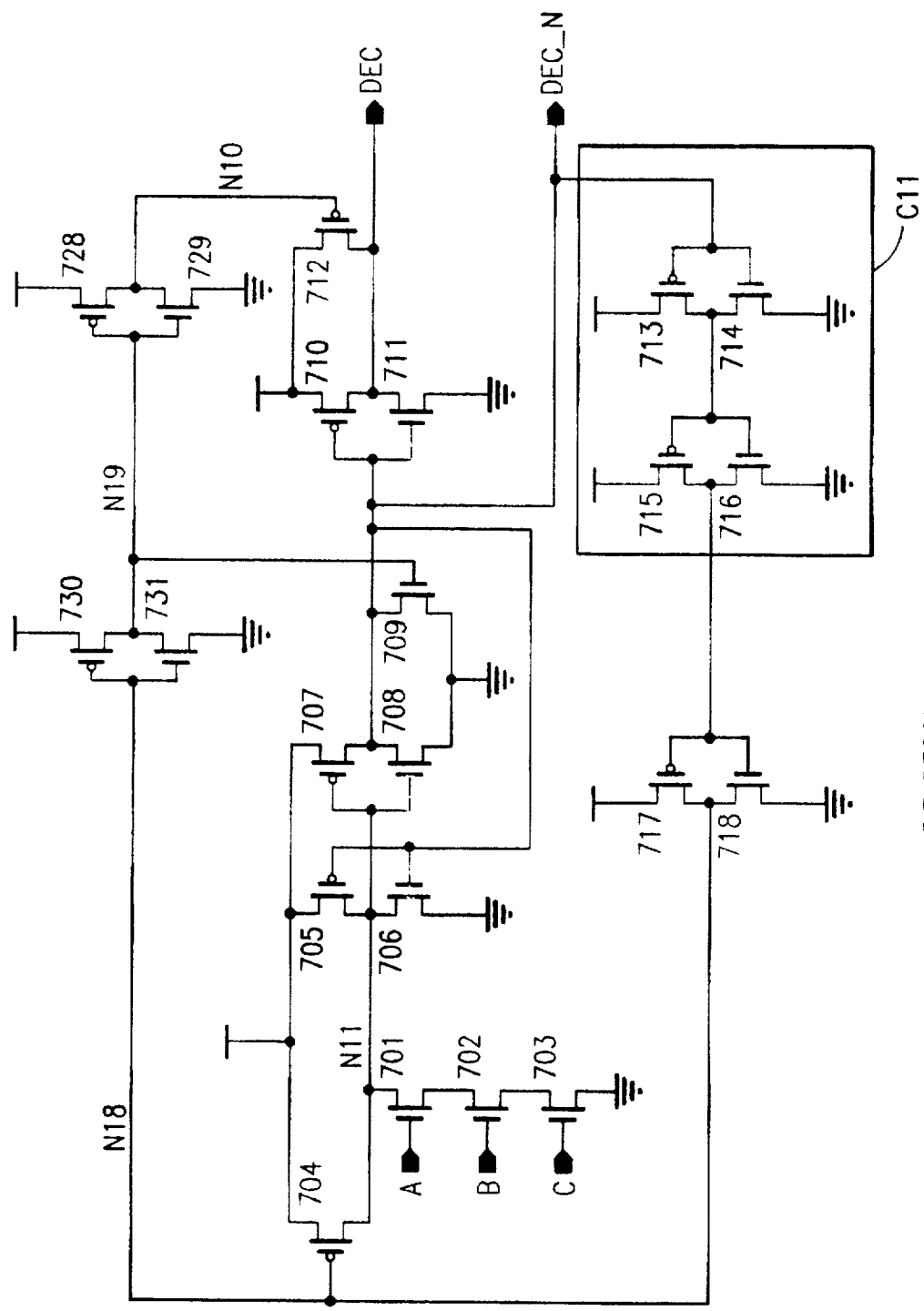
FIG. 7 BIT DECODER

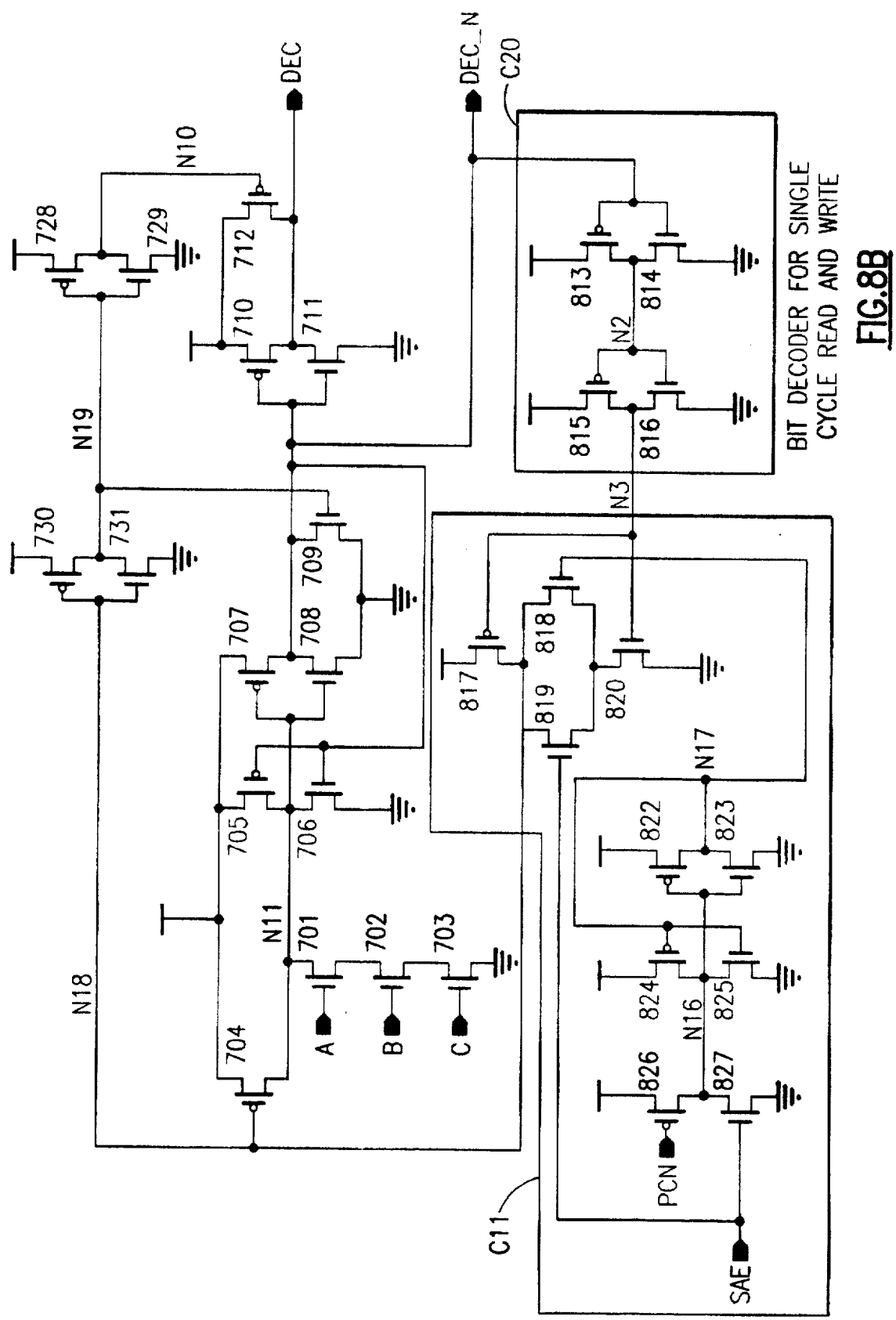
FIG.8B BIT DECODER FOR SINGLE CYCLE READ AND WRITE

PRECHARGED BIT DECODER AND SENSE AMPLIFIER WITH INTEGRATED LATCH USABLE IN PIPELINED MEMORIES

This application is a divisional of co-pending application Ser. No. 08/372,523, filed on Jan. 13, 1995, which is a divisional of Ser. No. 08/279,366, filed on Jul. 22, 1994.

BACKGROUND OF THE INVENTION

1. Field of the Invention

The present invention generally relates to a sense amplifier and bit decoder usable, for example, in electronic random access memories and, more particularly, to a sense amplifier with an integrated latch function combined with a bit decoder for memories which have extremely short access and propagation times and which may be operated in a pipelined mode to include, for example, a write-only access during a portion of a memory cycle and well as to perform other functions within the memory such as the concatenation of sense amplifier output fields read out over multiple memory operation cycles.

2. Description of the Prior Art

Electronic data processing, at its most basic level, usually involves a fetch of an instruction and/or data signal from memory, performance of an operation on or in response to that signal and storage of a resulting signal. The speed at which a data processing operation or instruction can be executed is therefore highly dependent on the cycle time required for a memory operation to retrieve and/or store a digital signal in memory. Digital signal storage can be done in many diverse media; each having characteristic properties, advantages and access times.

Static memories include a bistable memory element. Dynamic memories require refreshing since their memory elements rely on stored charge. Both static and dynamic memories typically use sense amplifiers to detect and amplify small signal voltage differences produced by the memory cells. Sense amplifier are designed to minimize noise sources: transistor parametric variations, charge sharing, signal coupling, and power supply noise.

Whether the memory is of the static or dynamic type, certain additional structure is necessary in order to access a particular memory cell, to determine its contents and to develop and deliver an output which is stable and reliably timed. Whether in the form of latches, gates inverters or other types of circuits, such structures generally perform logical functions within the memory device. In the past, such logic circuitry has been of generally the same design as would be used to perform logic functions in a processor or any other form of digital circuit. That is, the response of the circuit was generally designed to be approximately symmetrical relative to an input voltage level. Thus, when the input voltages, often including a clock signal, became relatively stable, a stable output and sufficient noise margins were generally assured and recovery from noise disturbances were possible within the same clock cycle. (These forms of logic circuit will be referred to hereinafter as static logic to more readily distinguish from so-called precharged logic circuits, occasionally referred to as dynamic logic, which follows.)

More recently, several significant advantages over static logic circuits have been realized by the development of logic circuit designs which are highly asymmetrical in response to both input voltage levels and response speed. The basic theory of the response speed improvement in such devices is that propagation time of a logic element will be minimized if the circuit can be brought to a logic state from which it may rapidly be switched to another logic state before data is applied to it. Then, when data is applied, switching of the logic state is only done when the input signal requires such a change. Thus, the circuit can be easily optimized to enhance the speed of such a transition. The establishment of the logic state before an input signal is applied is generally referred to as precharging.

Other advantages also accrue from such logic designs. Consider, for example, a CMOS inverter comprised of an N-channel FET and a P-channel FET. To obtain symmetrical response, the P-channel FET must be of approximately twice the size (and gate capacitance) of the N-channel FET. In a dynamic or precharged logic device having a comparable function, complementary transistors need not be provided with a consequent decrease in element count and gate capacitance. Moreover, the transistor used to provide or hold the precharged state may be very weak (e.g. of relatively low conductivity) and thus of reduced size.

Unfortunately, while the potential gains in speed of operation are substantial using precharged or dynamic logic, response of the circuit is more sensitive to noise and recovery from a transition triggered by noise cannot readily be accomplished within the same cycle time (e.g. a clock cycle or a memory operation cycle).

For this reason also, precharged logic circuits require meticulous tracking and analysis of effects such as noise sources, charge sharing, signal coupling, power supply considerations and the like, particularly when used in critical paths of digital signal processing circuitry. In this regard, it should be understood that digital signal processing generally involves logical operations on combinations of signals and signals of the correct logical levels must be present at the time the logical operation is carried out in order to achieve the correct result. Therefore, variations in signal level which may be encountered in normal operations of digital circuits may cause erroneous operation when applied to precharged logic circuits unless timing is carefully analyzed and controlled to assure that voltage levels will be properly recognized as the logical states they are intended to represent.

However, precharging of a circuit and the design of circuits in which precharging can be exploited are not necessarily straightforward since states of transistors may be achieved which cause transient serial conduction paths if precharge and evaluation transistors are simultaneously active. This results in excessive power consumption which may, in turn, affect response speed or pull voltage levels away from the intended logic states. Precharging can thus easily defeat the gains to be derived by design for asymmetrical circuit response and precharging, particularly where precharging proceeds in a sequence of steps. Further, providing a high impedance state of one or more transistors may increase susceptibility of the circuit to noise from any of several sources which would be especially deleterious to the operation of a precharged circuit.

It should also be noted that the above asymmetrical response speed design concept and precharging cannot reliably be used in circuits which receive signals from a circuit which is not driven solidly to logic level voltages (e.g. power supply and ground). If such a circuit is precharged and supplied with an ambiguous input voltage, the output may be in error since precharge logic circuits, by their nature, have little noise tolerance and thus may result in outputs having voltages which are even more ambiguous as well as including effects of noise sources and power supply variation (e.g. "bounce") when common-mode currents are drawn; possibly being of sufficient severity to cause erroneous operation or triggering of a precharged circuit. When such a circuit (including dynamic logic circuits) is erroneously triggered after precharge, it is virtually impossible and certainly highly impractical to provide for recovery prior to the next operation cycle.

In view of the above design considerations, it is often attractive to mix dynamic and static types of logic circuitry to optimize both the design efficiency and performance of a particular digital processor arrangement or logic directly responsive to memory output memory. For example, it is known to add a static latch to a sense amplifier to extend the time period during which a bit read from memory will be available beyond the end of a particular memory cycle.

As is known, sense amplifiers generally operate by initially bringing a bistable circuit to a balanced condition between its stable states; from which condition, the sense amplifier can be unbalanced and made to assume one of its stable states by an extremely small voltage difference. Therefore, a sense amplifier must be precharged. Precharging must be completed prior to the development of the small voltage difference (which represents the memory cell state) on the sense amplifier internal nodes. A small voltage must exist at the inputs of the sense amplifier in order for proper operation of the sense amplifier to occur.

By the same token, since precharge of the sense amplifier also balances the voltages on the output nodes, data is not available from the sense amplifier once precharging of the sense amplifier has begun. Additionally, in known designs which add a static latch to the sense amplifier, the static latch must be reset or precharged prior to a subsequent enabling of the sense amplifier. Therefore, some aspects of timing may remain critical when extremely high speed of operation is required.

It should also be understood that, at the present state of the art, substantial design effort may be expended to obtain a seemingly small percentage increase in response speed. An improvement of 10%, for example, is considered to be a very large improvement. One reason for the difficulty in obtaining larger improvements is that each design strategy, such as precharging of circuits with asymmetrical response speeds, also requires a finite amount of time to carry out and some finite time margin to reach a stable operating state of the circuit in response to such an operation. For example, if precharging does not occur sufficiently early in a memory cycle to be completed before a memory cell is accessed to couple the memory cell output to the sense amplifier, malfunction of the sense amplifier may occur because the precharge network will retard the development of a differential voltage on the sensing nodes.

Other uses of a sense amplifier within a memory device, such as multiplexing inputs thereto to provide additional operations within a single cycle can also cause an erroneous write to memory unless precautions are taken. As alluded to above, much design effort has been expended in seeking to obtain several operations within a single clock cycle. One such technique is referred to as pipelining, in which several operations, which may be of different types (such as read and write) regularly occur at different phases of the same clock cycle. For example, a memory which provides two read-write operations and one write-only operation in a single processor cycle of 15 nanoseconds is disclosed in "A 200 MHz Internal/66 MHz External 64 kB Embedded Virtual Three Port Cache SRAM" by G. Braceras et al., 1994 International Solid State Circuits Conference, ISSCC94/ Session 15/Static memory for High-Bandwidth Systems/ Paper FA15.3, which is hereby incorporated by reference.

SUMMARY OF THE INVENTION

It is therefore an object of the present invention to provide a memory including a sense amplifier including a latch and multiplexer and using asymmetrical response speed circuits with precharging which is capable of directly driving static and precharged types of logic circuits.

It is another object of the invention to provide a sense amplifier for a memory which has a high degree of noise immunity.

It is further object of the invention to provide support circuits for a memory to enable performance of both a read operation and a write operation within a single operating cycle delineated by a clock.

It is yet another object of the invention to provide a latching function of a sense amplifier such that data read from memory can be selectively maintained over a plurality of memory cycles in order to support additional memory operations such as concatenation of data fields.

In order to accomplish these and other objects of the invention, a precharged sense amplifier arrangement is provided including a bistable differential amplifier, an arrangement for enabling sensing of a differential voltage by the bistable differential amplifier including an arrangement for causing latching of outputs of the differential amplifier, and an arrangement for precharging at least the arrangement for enabling sensing and inputs of the differential amplifier in sequence, including an arrangement for resetting the arrangement for causing latching of outputs of the differential amplifier.

In accordance with another aspect of the invention, a sense amplifier support circuit is provided including a decoder, an arrangement for gating a reset of the decoder, an arrangement for precharging the decoder in response to a logic state of an output of the decoder subsequent to a reset of said decoder, and an arrangement for simultaneously disabling all outputs of said decoder.

In accordance with a further aspect of the invention, a method of operating a memory including a sense amplifier including a bistable differential amplifier selectively connectable to a plurality of bit lines is provided including the steps of precharging the sense amplifier in response to a precharge signal, enabling the bistable differential amplifier to amplify a voltage difference connected to inputs thereof in response to a sense amplifier enable signal, latching an output of the bistable differential amplifier, and terminating the latching step in response to a precharge signal.

In accordance with yet another aspect of the invention, a method of operating a memory device including at least two sense amplifiers, each of said at least two sense amplifiers including means for precharging a respective one of said sense amplifiers in response to a precharge signal is provided including the steps of performing a read operation concurrently with the at least two sense amplifiers, interrupting a precharge signal to at least one of the at least two sense amplifiers, and performing a further read operation with at least another of the at least two sense amplifiers in the same cycle as the interrupting step.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a generalized depiction of a dual slope sense amplifier,

FIGS. 4A and 4B, is a schematic diagram of the core sense amplifier circuit of the present invention, FIG. 6 is a timing diagram illustrating the operation of the invention, FIG. 7 is a schematic diagram of a bit decoder usable in the circuit of FIG. 6, FIG. 8B is a variation of the bit decoder of FIG. 8A.

DETAILED DESCRIPTION OF A PREFERRED EMBODIMENT OF THE INVENTION

Figure 2A:
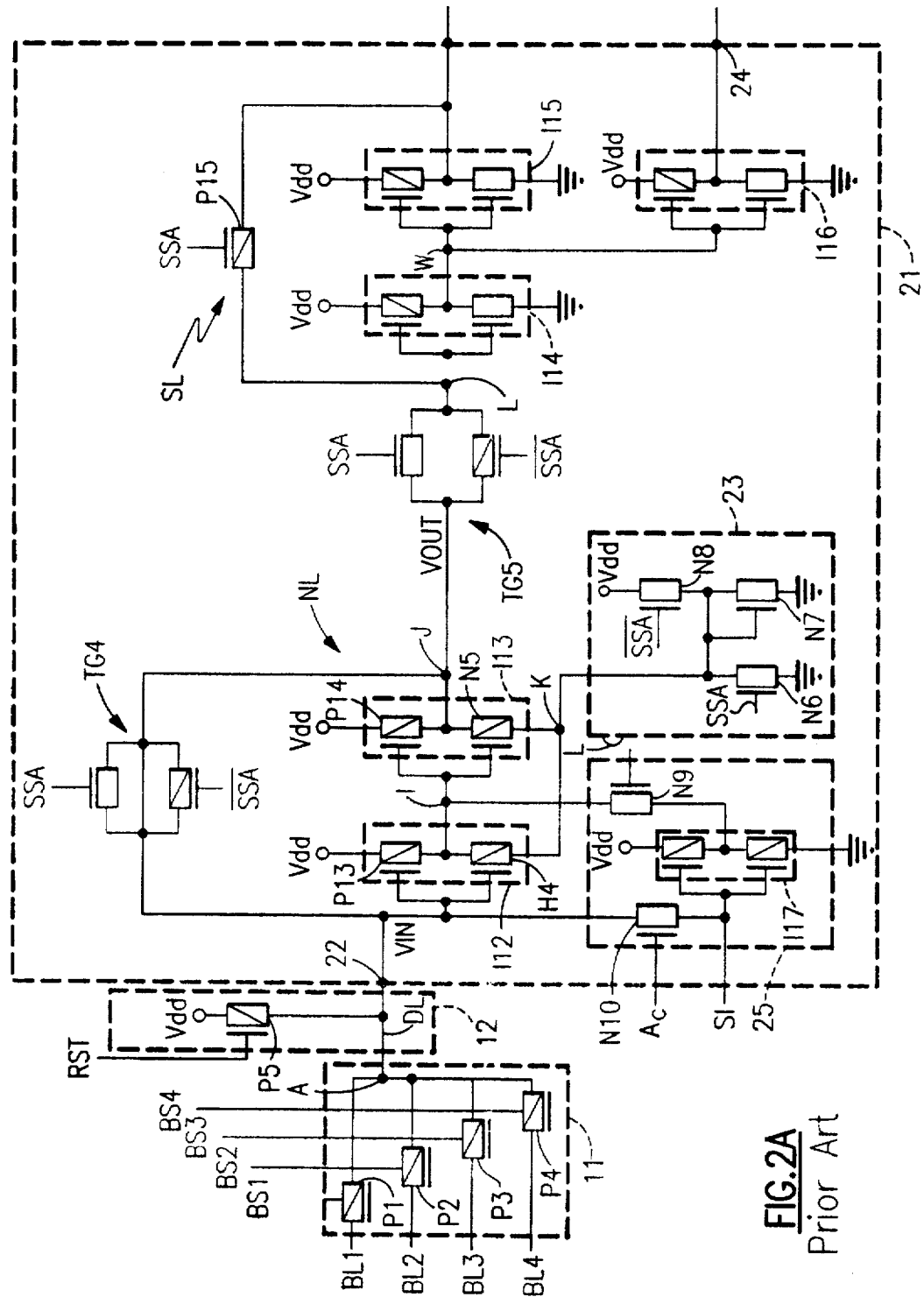
FIGS. 2A and 2B, is a circuit disclosed in U.S. Pat. No. 5,204,560 which is useful in understanding of some aspects of the present invention.

Referring now to the drawings, and more particularly to FIG. 1, there is shown a generalized depiction of a dual slope sense amplifier similar to that employed in the present invention. It is to be clearly understood that no admission is made that any portion of the depiction of FIG. 1 is prior art as to the present invention or that any particular known device is depicted. The depiction of FIG. 1 is intended to convey a general understanding of the design of a particular type of sense amplifier over which the present invention provides an improvement in order that certain features of the present invention may be more readily understood.

The term dual slope sense amplifier derives from the design feature that the sense amplifier enable signal, SAE, first turns on a small transistor 21 of low conductance to bias the cross-coupled differential amplifier 18, 19 after an initial voltage (typically 100-200 mV for 2.5 volt technology) develops across the active bit lines. Then, once sufficient voltage is developed across nodes N1, N2, (typically 500-1000 mV) transistor 31 is activated to rapidly complete the sensing operation. Specifically, this low conductance transistor 21 draws a small current from node N4 and tending to pull the voltage at N4 toward ground, permitting conductance of the sensing transistors 18 and 19 connected to nodes N1 and N2, respectively.

However, due to the cross-coupled connection of transistors 18 and 19, the conductance of one will increase while the other will decrease, depending on the differential voltage from the bit lines connected thereto. The sense amplifier enable signal is also delayed for a short period by the serial propagation times of inverters I1 and I2 at nodes N5 and N6, respectively, before being applied to a second, high-conductance, transistor 31 which completes the sensing operation and brings node N4 and one of nodes N1 and N2 solidly to ground and the sense amplifier to a stable operating state at increased speed. This two-stage operation thus avoids a large common-mode current from being drawn through both sides of the cross-coupled sense amplifier circuit when the sense amplifier is in a relatively balanced conduction state where nodes N1 and N2 are close to the same voltage (differing only by a voltage due to voltage difference of the memory cell and both transistors 18, 19 of the sense amplifier are in a conductive state).

This mode of operation reduces the possibility of falsely triggering the inactive output of the sense amplifier which ultimately permits the sensing of small differences in input voltage. Further, any noise or rise at the inactive output could falsely trigger dynamic logic gates which are driven by the sense amplifier and which have reduced noise margins compared with static circuits.

Also shown in FIG. 1 is a multiplexor or bit switch C1 which serves to selectively connect the bit lines BL or other signals to the differential input nodes N1, N2 of the sense amplifier. The multiplexor C1 of FIG. 1 is often provided in two portions: a first portion, often referred to as a bit line switch which receives bit line decode signals to connect a particular bit line to the sense amplifier, and a second portion, also commonly referred to as a multiplexor (but distinct from the bit line switch) for alternatively providing connection to other signals when the bit line switch is inactive. It is common practice for this second multiplexor portion (hereinafter referred to by the abbreviation "mux" to distinguish the term from multiplexor C1) to be used to clamp other circuitry to the sense amplifier for purposes of memory testing, such as is shown in U.S. Pat. No. 5,204,560 to Bredin et al.; a schematic diagram of which is shown in FIG. 2.

Figure 2:
FIG. 2, comprising
Figure 2B:
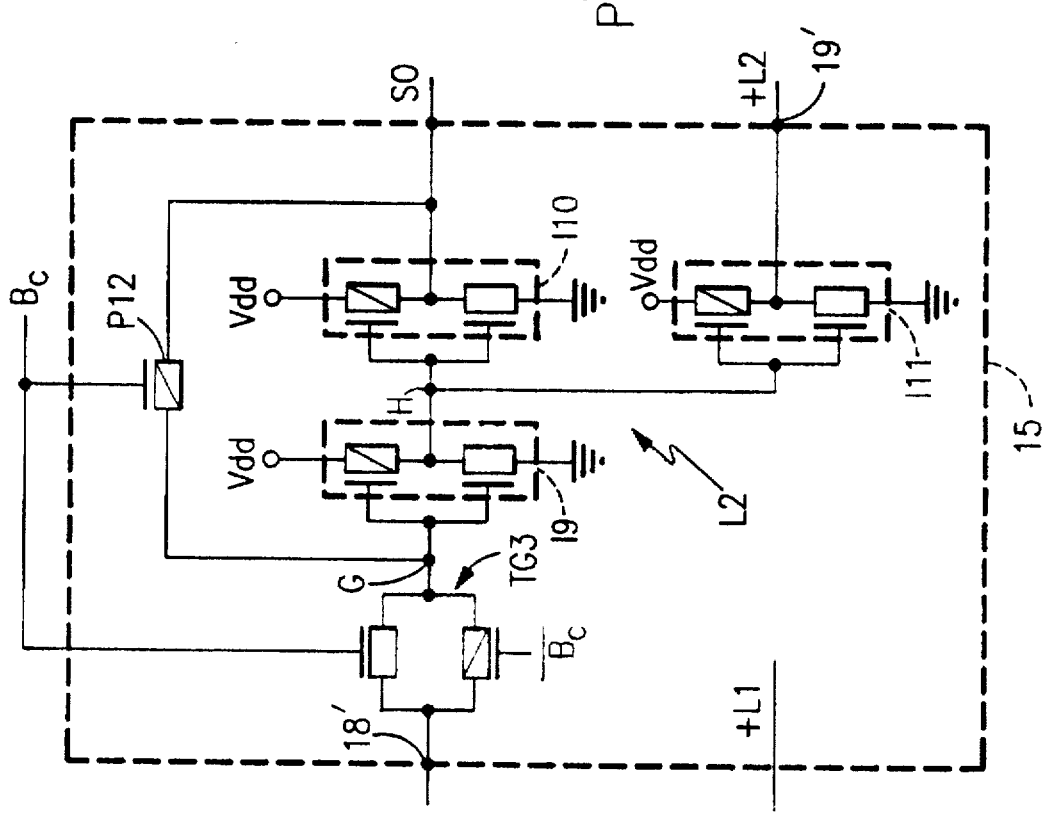

In the circuit shown in FIG. 2, it can readily be appreciated that bit line switching is done in the circuit enclosed by chain line 11 and the mux is enclosed by dashed line 25. The mux is enabled during testing procedures by an additional clock signal $A_C$ in addition to clock signal $B_C$ which is used to gate the output signal. The $A_C$ clock is only asserted in the testing mode when the bit line switching circuit 11 is idle. Conversely, mux 25 is disabled by the absence of the $A_C$ phase clock pulse during system operation. It should be further noted that the mux 25 of Bredin cannot be used during system mode operation since there is no provision for assuring an absence of selection in the bit line select switching circuit when the mux 25 is enabled, as is necessary for SRAMs.

Figure 3:
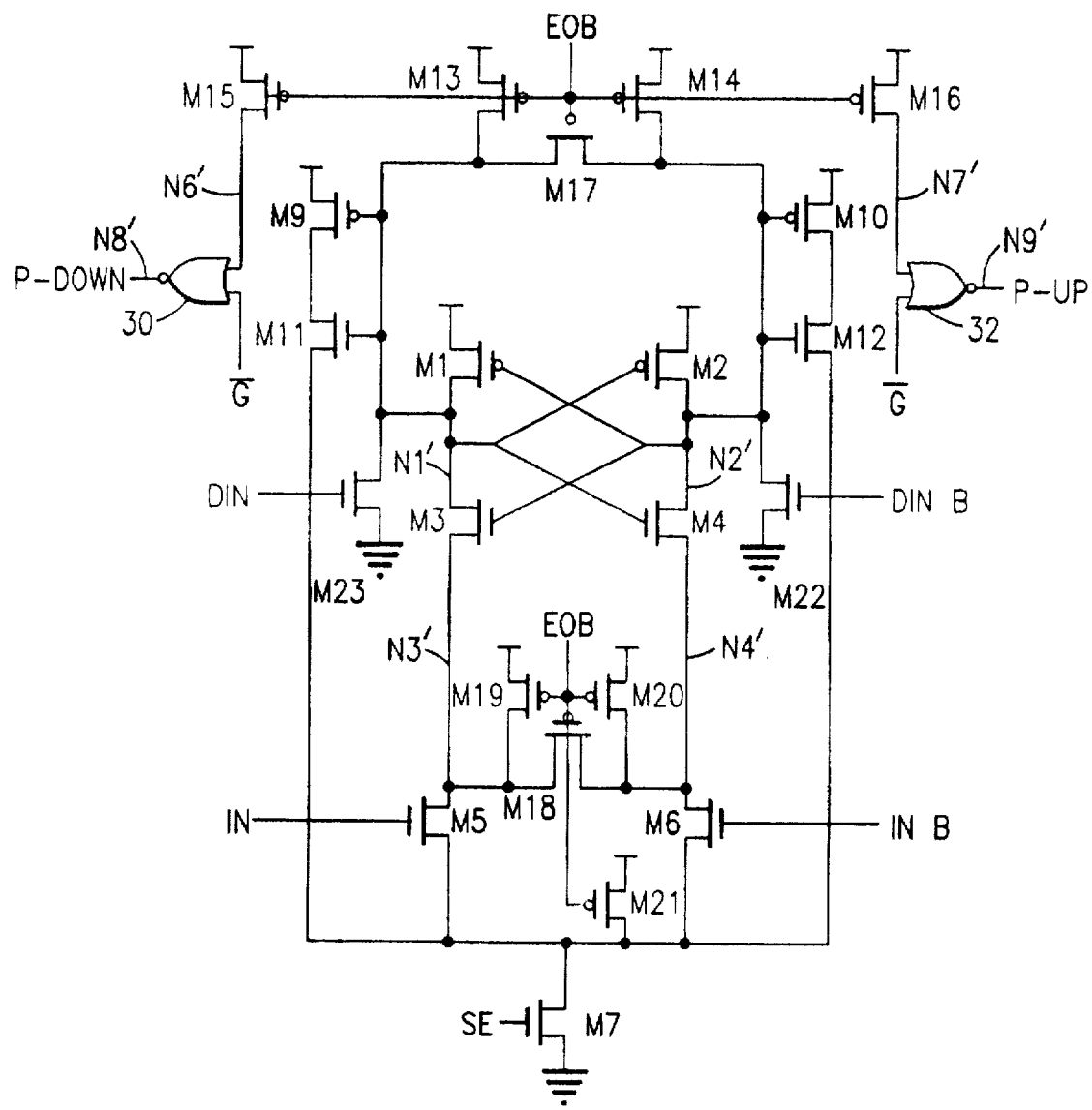
FIG. 3 is a circuit disclosed in U.S. Pat. No. 4,843,264 which is useful in understanding of additional aspects of the present invention, FIG. 4, comprising

Referring now to FIG. 3, a known implementation of an integral latch with a sense amplifier is shown as disclosed in U.S. Pat. No. 4,843,264 to Galbraith. In this circuit topology, a pre-amplifier is formed by transistors M5 and M6, together with transistor M7 prior to a cross-coupled differential amplifier formed by M3 and M4. The differentially applied input signals IN and IN B are thus amplified by transistors M5 and M6 before they reach the latching nodes N1' and N2' (primes being added to node reference numbers in FIG. 3 to distinguish from the node reference numbers used to explain the invention). Further, when the enable signal is asserted low during precharge of the sense amplifier circuit, the sense amplifier output nodes N6' and N7' are precharged high by a downward pulse on EQB through transistors M15 and M16. Since nodes N1' and N2' are high, M9 and M10 are off. The remaining transistors M11 and M12 are off since their sources have been precharged high by M21. That is, during precharge, transistors M15, M9, M11, M16, M10 and M12 are all inactive prior to enable signal SE again being asserted high so that dynamically stored charge can be used to keep N6' and N7' high. However, the high impedance states of inactive transistors M9-M12 is susceptible to noise disturbances.

Figure 4A:
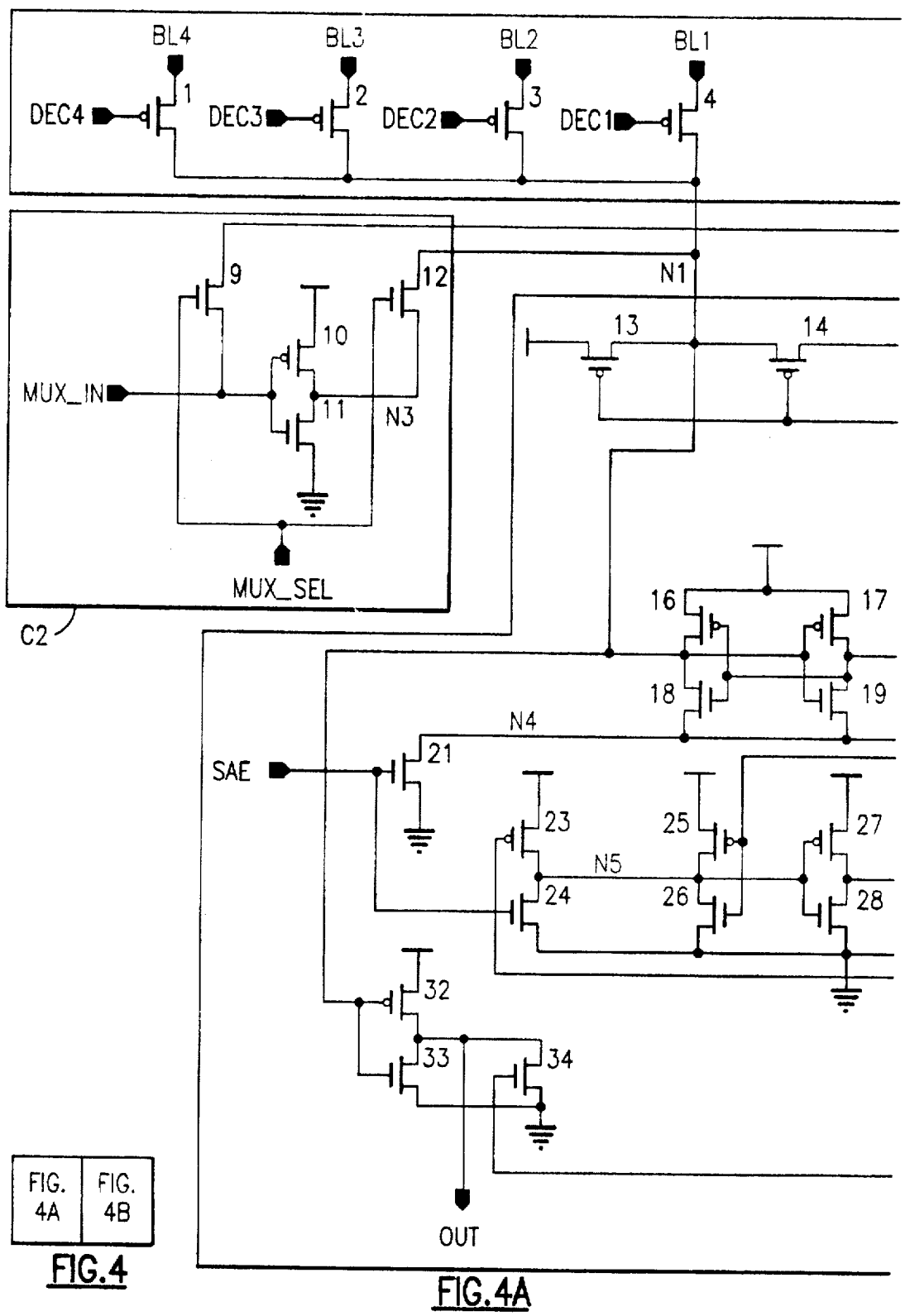

In contrast to the known arrangements illustrated in FIGS. 2 and 3, a preferred embodiment of the invention, shown in FIG. 4, provides both an integrated latch and multiplexor for the sense amplifier depicted in FIG. 1. As an overview, the improved latching section of the sense amplifier separates the sense amplifier enable signal SAE from the precharge signal pcn (precharge negative; the precharge signal being considered active when low) which allows fast and direct precharge of the latch such that precharge is accomplished before the address decoding is completed in the bit line select switching circuit. Further, the separation of the sense amplifier enable function and the precharge function allows data to be statically held by the latch beyond the termination of the sense amplifier enable signal SAE until the static latch is reset by another precharge signal pcn.

More specifically, the circuit of FIG. 4 may be initially considered as including three major functional elements: bit line switching is provided by the circuit enclosed in box C1, the mux switching is provided by the circuit enclosed in box C2 and the sense amplifier, including an integral latch and precharge circuit, is enclosed in box C3. (reference numerals used in FIG. 1 correspond to the same elements in FIG. 4 except that both bit line select circuit C1 are both included within box C1 of FIG. 1.)

As shown in FIG. 4, the cross-coupled differential sense amplifier is preferably provided by a pair of cross coupled inverters comprising complementary transistors 16, 18 and 17, 19, respectively. Sensing nodes N1 and N2 are precharged and equalized by transistors 13 and 15, which are connected to the power supply voltage, with transistor 14 connected between the sensing nodes N1 and N2 so that transistors 13, 14 and 15, when simultaneously conductive, form a single node connected to the power supply voltage. Output buffer amplifiers, such as are formed by transistors 32, 33, and 36, 37, each precharged by transistors 34 and 35, respectively, are preferably provided for each of the sense amplifier outputs but are only important to the practice of the invention to the extent that they repower the sense amplifier signal.

The sensing transistors 18 and 19 are connected to ground by transistors 21 and 31 which are operated in sequence as discussed above with reference to FIG. 1 to provide a dual slope function in the sensing operation. Note also that the function of transistors 16 and 17 is to return the high node, either N1 or N2 to the power supply voltage since inevitable common mode current through transistors 18 and 19 will otherwise cause the high node to droop. Additionally, a transistor 30 of complementary conductivity type to transistor 31 is provided to precharge node N4 to the positive power supply to disable transistors 18 and 19 to further ensure a balanced state of the sense amplifier prior to sensing. The delay provided by the propagation times of inverters I1 and I2 of FIG. 1 are preferably provided (as shown in FIG. 4) by inverters formed of transistor 24 (I1), precharged by complementary transistor 23, and both transistors 27 and 28 (I2), respectively, precharged by transistor 29. Transistors 25 and 26, connected as an inverter to the input of transistors 27 and 28 of inverter I2, are small, low conductance transistors which are used to latch the SAE signal voltage on node N6 for transistor 31.

The sense amplifier support arrangement of FIG. 4 is precharged in several stages in response to the pcn signal; the delay to establish these stages being provided by a sequence of three inverters having outputs on nodes N7, N8 and N9, respectively. The pcn signal, itself, is coupled to precharge transistor 23 to precharge inverter I1 and cause resetting of inverter I2, in turn, as well as to the input of the sequence of inverters which establish the precharge sequence in accordance with the invention. A delayed and inverted precharge signal appearing on node N7 is then applied to transistor 29 to pull node N6 to ground. Pulling node N6 to ground, in turn, turns off transistor 31 and activates precharge transistor 30 to pull node N4 up to the power supply voltage and inactivate the sense amplifier.

In this regard, it is important to an understanding of the invention that transistor 31 provides a latching function for the sense amplifier outputs. In previous sense amplifier arrangements, it was customary to continue the sense amplifier enable signal, SAE, at an active level until precharge was initiated in order to maintain the output levels in accordance with the voltage differential which was sensed. Since, in the absence of a pcn signal which causes a high level on node N7, node N6 will remain high due to latching of the SAE signal by the feedback inverter circuit preferably comprising transistors 25 and 26. This high level on N6 maintains transistor 31 in an active, conductive state to maintain the sense amplifier output. Therefore, the SAE signal can be reduced to a very short pulse which need be of only sufficient duration to allow the onset of amplification of the voltage differential developed (e.g. the start of the dual-slope amplification function) and applied to the sense amplifier from the bit lines. Thus, the latching function is separated from the duration of the SAE signal and is controlled entirely in response to the delayed pcn signal at node N7. Accordingly, the data in the sense amplifier can be maintained well into the next clock cycle and, furthermore, other memory operations may be provided in the same memory cycle in which a read is performed.

The output of the next inverter in the sequence, node N8 (which is active when low), is applied to transistors 13, 14 and 15 to precharge the input/output nodes of the sense amplifier. It should be noted that, as pointed out above, transistor 31 is turned off by a low voltage at node N6 when transistor 29 is turned on by the input on node N7 to this inverter stage. Transistor 31 is thus inactive before transistors 13, 14 and 15 become active in response to a down-going pulse on N8. This sequence prevents large currents being drawn through sensing transistors 18 or 19 during precharge.

The output of the last stage of the sequence of inverters, node N9, which is active when high), is applied to the gates of precharge transistors 34 and 35 to precharge the output buffer amplifiers of the sense amplifier to a low level. The propagation delay of this last inverter approximately matches the time of precharging of the input/output nodes N1, N2 of the sense amplifier which turns off transistors 32 and 37, again to prevent a large current being drawn through either of the buffer amplifiers during precharge.

From the foregoing, it is seen that the circuit of FIG. 4 provides for precharge of all components within the propagation time of three inverter stages, and thus less than the time for propagation of a signal through the bit line decoder C1. In this regard, it should be noted that a decoder suitable for producing a 1-of-n code (to enable a single bit line or pair of bit lines) must include at least one AND gate or its equivalent which must, in turn, include at least two serial stages through which a signal must be sequentially propagated (e.g. a true-complement generator and combinatorial logic) and the bit switch transistor (e.g. 1-8 of FIG. 4) will have an additional propagation delay. Therefore, the duration of the precharge operation may, in fact, be fairly closely matched (but nevertheless shorter than) to the duration of the decoder operation, particularly in regard to the preferred embodiment thereof as will be discussed below in connection with FIG. 5. This condition is important to the invention since coupling of bit lines to the sense amplifier while the precharge operation continues would interfere with the development of a differential voltage from the active memory cell. By ensuring that the precharge completes slightly before the decoding operation can complete, even with an optimal decoder, this condition will unconditionally be achieved with no time penalty in the operation of the memory.

This timing during the operation of the precharge portion of the circuit of FIG. 4 is evident from the "cycle 1" portion (which is actually a first portion of a memory operation cycle in the preferred embodiment of the invention) of FIG. 6 in which the PCN signal is slightly delayed from the clock pulse which establishes a memory cycle. The clock signal is preferably provided by a local clock synchronized with a system or processor clock, as is well-understood in the art. The width of the pcn pulse is such that the pcn pulse terminates prior to the assertion of the word line and bit line decoder outputs. The last portion of the precharging operation, responsive to a delayed pcn pulse at node N9, which precharges (precharged low) the outputs (out and out__n) of the output buffer amplifiers is performed after N1 and N2 have been precharged. This precharge of the sense amplifier support arrangement outputs enables dynamic logic (e.g. precharged domino logic) driven by the sense amplifier to precharge after the outputs of the sense amplifier are precharged low and before assertion of SAE.

It should also be noted that, as discussed above, SAE is thus decoupled from the resetting of a latch for holding a data signal beyond the end of a clock cycle period since the sense amplifier, once enabled, will function as a latch until the fast set transistor 31 is turned off by the precharging operation. Therefore, the latching function of the sense amplifier provides stable outputs until the next cycle begins. In contrast, for example, in known self-resetting CMOS where precharge is triggered from the sense amplifier outputs, the outputs return low before the end of the cycle time which causes subsequent logic to return erroneous results unless a separate latch is provided at the logic inputs.

The bit line selector switch section of the multiplexor is shown enclosed in rectangle C1 is of conventional design, the particulars of which are unimportant to the practice of the invention. As depicted, the bit line selector switch includes as many transistors as bit line it may be desirable to connect to the sense amplifier; four pairs (for differential sensing) being shown in the example of FIG. 4. These transistors are preferably arranged in corresponding groups to correspond to bit line pairs connected to memory cells. Gates of these groups of transistors 1–4 and 5–8 are respectively connected to receive a 1-of-n code from a decoder such as that included in the sense amplifier support circuit of FIG. 6. These transistors then function as transmission gates to connect respective sense amplifier inputs N1, N2, to respective bit lines of a bit line pair (e.g. bl1, br1; bl2, br2; bl3, br3; bl4, br4) connected to a row or column of memory cells.

The mux section of the multiplexor is shown enclosed in rectangle C2 which is preferably constituted by an inverter comprising complementary transistors 10 and 11 receiving a mux__in input and transistors 9 and 12, functioning as transmission gates controlled by a mux__sel input to deliver the mux__in input signal and its complement to the inputs N1, N2, of the sense amplifier and, when turned off, to prevent drawing current from sense amplifier nodes N1 and N2 during a read operation.

As alluded to above, the operation of the mux and the bit line select switch must be mutually exclusive. This mutual exclusivity is achieved in the circuit of FIG. 3 by the use of different and mutually exclusive clocks for respective operational and test modes and which thus effectively precludes use of a mux to couple signals to the sense amplifier during the operational mode. This limitation is avoided, in accordance with the arrangement shown in FIGS. 6 and 8.

Figure 5:
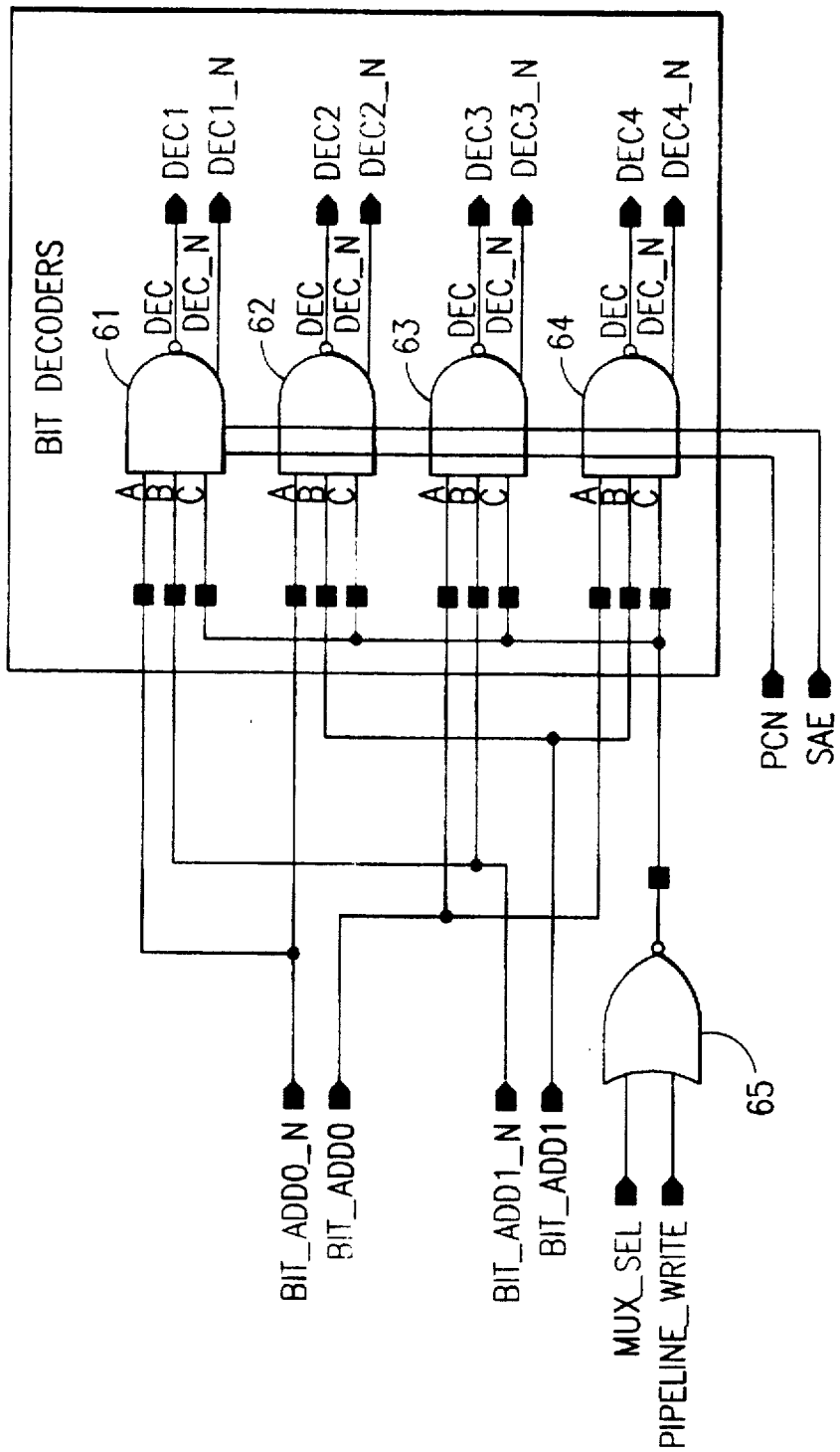
FIG. 5 is a logic diagram of the sense amplifier support circuit in accordance with the present invention.

As shown in FIG. 5, the portion of the sense amplifier support circuit which drives the bit switch of FIG. 4 comprises bit decoders preferably formed of an array of AND gates 61–64, each arranged to provide both true and complement outputs, (e.g. dec1 and dec1__n). The number of AND gates is one-half the number of transistors (e.g. equal to the number of pairs of transistors) in the bit line select switch. Each AND gate is connected to a unique combination of true and complement inputs of the bit line address in order to detect a unique combination thereof, as is appropriate to a 1 of n code. However, in accordance with the invention, each of the AND gates 61–64 is also provided with an additional input which receives an inverted (e.g. by NOR gate 65) mux__sel (or write) signal to cause the outputs of all AND gates to be driven to the same (e.g. logical "0") state when the mux__sel signal is active. (An asserted write signal is the same as or derived from the mux__sel signal with the multiplexer input off. A pipelined write operation does not enable the mux port.) Thus, all bit switch transistors may be simultaneously turned off and the sense amplifier input/output nodes isolated from the memory array in response to a mux__sel signal when it is desired to apply another signal to the sense amplifier or to decouple the bit lines from the sense amplifier from the bit lines during other operations. This enables a write or other memory manipulation operation to be performed in the same memory operation cycle without disturbing the data in the sense amplifier and serves to permit pipelining to be used to effectively increase the bandwidth of the memory and the processor connected thereto.

SAE is a timed signal which can be derived in many ways, such as by detecting an active word line, and applied to the gates 61–64 in conjunction with the pcn signal in a manner which will be discussed more fully below with reference to FIGS. 8A and 8B. However, the SAE and pcn signal inputs are not required for a simple self-resetting decoder circuit such as that shown in FIG. 7.

Also shortly after the end of the pcn pulse, the bit decode outputs are enabled and a voltage differential begins to form on the bit lines, discharging the parasitic capacitance thereof, assuming that the mux__sel signal is not asserted. As soon as a voltage differential which is reliably detectable by the sense amplifier has been developed, the SAE signal is asserted and the sense amplifier begins operation in the dual-slope mode described above (hence the three differently sloped regions at the leading edge of the bit line waveform).

As the sense amplifier pulls the bit lines and its output to the power supply voltages, the previously precharged low outputs of the sense amplifier arrangement also are pulled to different logic levels (e.g. at the power supply voltages. The latching action of transistor 31 is evident since the output voltages (out and out__n) are available once SAE is asserted until the precharge of the next cycle.

Further in FIG. 6, the time period labelled cycle 2 (which, as with cycle 1, can be included in the same system or processor cycle) may be used to connect data to the sense amplifier through the mux input as discussed above in regard to FIG. 4. As shown in FIG. 5, the mux sel signal (or its complement, derived from inverter 65, as the logic function of gates 61–64 dictates) is applied to gates 61–64 to drive the dec1–dec4 outputs to logical "0" (and the dec1_n–dec4_n outputs to logical "1") regardless of any other address signals applied to the decoder.

As shown in FIG. 6, the waveforms of cycle 2 are very similar to those of cycle 1 except that no bit decoder output occurs since it is suppressed by the mux_sel signal. A slight voltage fluctuation occurs on the bit lines due to partial select in response to the word select signal but this fluctuation is blocked from reaching the sense amplifier. The assertion of the SAE signal causes the precharged outputs to assume states corresponding to the logical value of the data input to the mux; again latching the data until the precharge in the following cycle.

Furthermore, the pcn signal can be gated or otherwise controlled (e.g. suppressed) to allow the latch to continue to hold data indefinitely for any desired purpose such as pipelining of operations as will be discussed in further detail below. For example, by suitably interrupting (e.g. with an AND gate) the delivery of a pcn signal and disabling the bit decoder with a bit decoder disable signal (e.g. a pipelined_write signal) to a particular sense amplifier or group of sense amplifiers in a memory, a stored bit or group of bits can be stored and held while other bits may be selectively read from memory or input through the mux port. In this way, data fields can be concatenated in any desired manner and for any purpose. Such a function could be particularly useful for changing or suppressing flag bits or error checking bits.

A suitable form of a gate (e.g. 61–64 of FIG. 5) is shown in detail in FIG. 7. This form of gate circuit also utilizes precharged logic for high response speed and is self-resetting. Thus a pulse of a predetermined pulse width or length is produced and provided to the bit switches. More specifically, an AND/NAND function is provided by the series connection of transistors 701, 702 and 703 (or more if desired) in conjunction with precharge transistor 704 and noise suppression transistor 705 (also referred to as a half-latch).

The configuration of decoding transistors is not important to the practice of the invention and other forms of decoding logic can be used. However, in the exemplary configuration shown, transistors 701–703 must all be conductive to sense a particular combination of input signals. When all of these transistors are conductive, N1 is pulled down and a low voltage applied to the gates of transistors 707 and 708, connected in inverter configuration. The output of this inverter is fed back to another inverter including transistors 705 and 706 which thus forms a latch with the inverter having transistors 707 and 708. Transistors 705 and 706 are preferably sized to be of low conductance since they need only form a weak input latch for transistors 707 and 708.

The output of the inverter including transistors 707 and 708 is provided as an inverting or complement output, dec_n, of the decoder gate and is also used to initiate reset and precharge of the decoder gate, as will be explained in greater detail below, since a high logic level at the dec_n output node disables the bit line precharge circuits 1109–1111 and enables the write transistors 1108 and 1112 of FIG. 10. The true output, dec, of the gate, to complete the AND function is provided by an additional inverter including transistors 710 and 711. (As regards the true/complement nomenclature, it should be noted that transistors 1–8 of FIG. 4 are rendered conductive when a low logic level is applied thereto which may also be considered to be within the AND function of the gate.)

The self-resetting precharge functions of the circuit of FIG. 7 are carried out in the following manner. The input address signals are assumed to be relatively short pulses, consistent with the intended processor high speed and short cycle time with which the invention may be used to greatest advantage. Therefore, the duration of the decoder gate output signals are governed by the delay provided in the reset and precharge loop preferably including five inverter stages in sequence, each having a predetermined propagation delay of a signal therethrough. Although any type of delay can be utilized, the first two stages, enclosed in box C10 and including transistors 713, 714 and 715, 716, respectively, correspond to a minimum time the bit switches 1–8 of FIG. 4 must be active for a voltage to build up on the bit line inputs to the sense amplifier sufficient for reliable logic level sensing. An additional delay is provided by a third inverter stage including transistors 717 and 718 which also derives an appropriate logic level for the preferred conductivity of transistor 704 which is sized to overcome 706. Once node N18 goes low in response to dec_n going high and after the delay and inversion of dec_n by the first three of the sequential inverter stages, node N11 is also precharged high by transistor 704.

Assuming the input pulse to at least one of transistors 701, 702 and 703 has terminated, the feed through current drawn through transistor 704 will be limited (after charging the capacitance of the node N11) by the relatively low conductivity of transistor 706. In this regard, the function of transistor 706 is to hold down node N11 after termination of the address pulses a, b and c until precharge is performed when that latching function is overwhelmed by conductance of transistor 704. (Transistor 706 can also be omitted in many instances because this condition of node N11 will often be satisfactorily accomplished by dynamic charge storage.)

The signal on N18 is then inverted and delayed by transistors 730 and 731 to provide a high voltage on node N19 drive transistor 709 to pull the output node dec_n low after transistor 707 has been turned off as described above. Then the voltage on node N19 is again inverted and delayed to pull node N10 low and control precharge of the dec output.

Figure 8A:
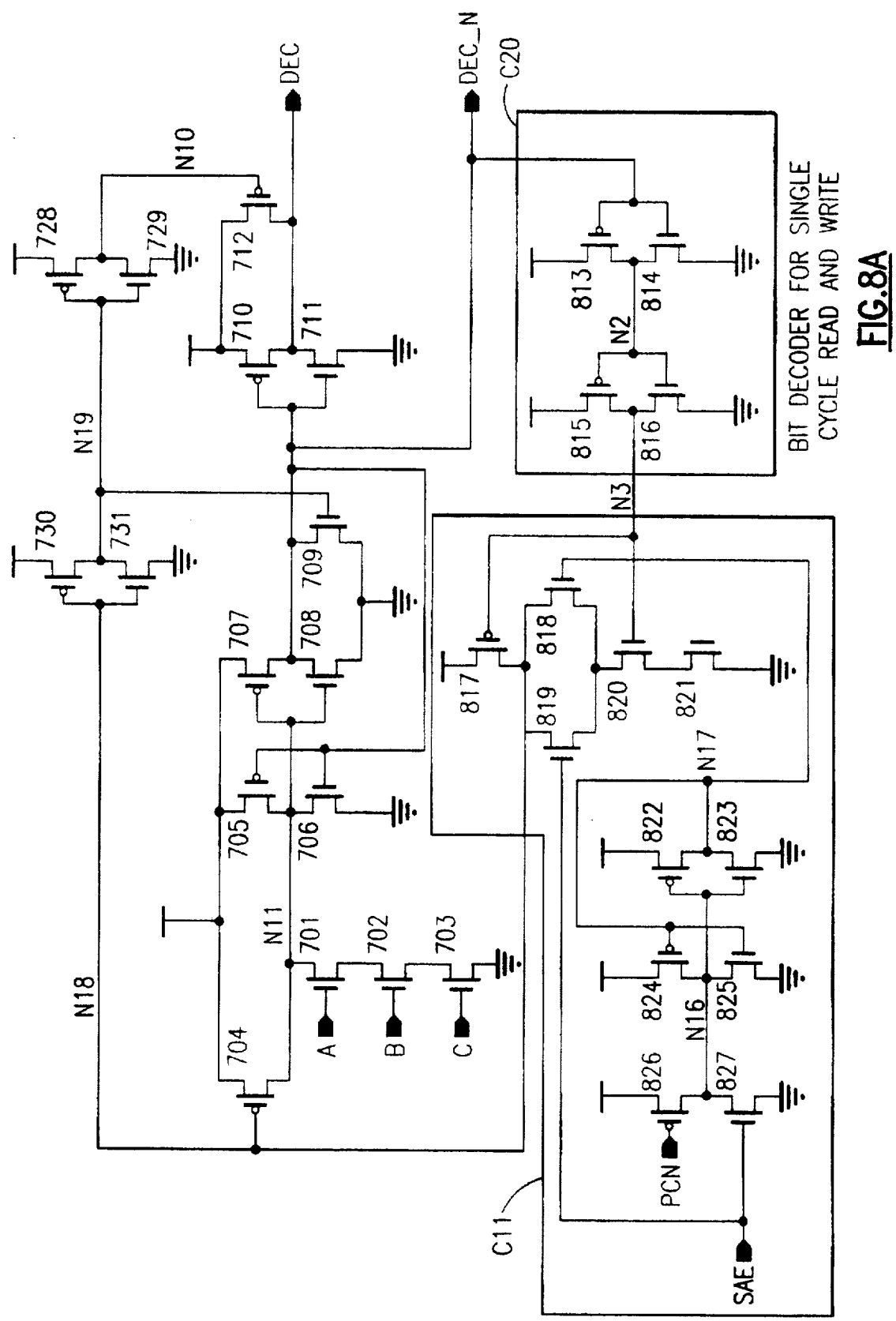
FIG. 8A illustrates another bit decoder allowing single cycle read and write operations.

A variant form of bit decoder for allowing single cycle read and write is shown in FIG. 8A. In this case, the circuit is modified to be partially self-resetting and precharge is externally controlled, in part, and gated by the SAE signal through the circuit enclosed in box C11. Otherwise, the operation of the circuit is generally the same as that of FIG. 7. Transistors and identified nodes common to both figures are labelled with the same reference numerals and need not be further discussed.

More specifically and as introduction to the following detailed descriptions of the circuit and operation of FIGS. 8A and 8B, the novel precharge/reset arrangement includes transistors 813–827. The goal of the precharge is to provide a wide active read pulse (or write pulse in the case of a write-through operation) in the first portion of the cycle for one address, an then in the second portion of the cycle, a narrower active write pulse which may be applied to the same or a different address. The data written in the second portion of the cycle is decoupled from the sense amplifier by suppressing the bit decoder (dec_n) output which drives the bit switches in circuit C1 of FIG. 4. A read operation requires more active pulse duration for evaluation (e.g. when bit lines are released and active) than a write. By arranging for the active pulse widths to be only as long as dictated by each of the read and write operations, respectively, the overall cycle time, which is equal to the sum the active signal (for evaluation of logic function), the precharge operation and the resetting of the precharge, can be reduced.

Thus in FIGS. 8A and 8B, transistors 822–827 capture the SAE pulse and hold it through the end of the cycle. The SAE signal may be pulsed twice in a read/write cycle with no effect of the sense amplifier latch or the bit decode reset. Transistors 822 through 825 form a latch which is cleared by the pcn signal at the beginning of the next cycle. The SAE signal thus gates the reset of the bit decodes and the circuit is arranged such that node N3 is high long before the arrival of the SAE pulse. During a read or write-through in the first portion of a cycle, the bit decoder can be reset after the sense amplifier is asserted through the SAE signal. During a further (e.g. write) operation in the second portion of the cycle, transistor 818 stays active since the active SAE signal is latched onto node N7. Thus the reset progresses more quickly because reset is not gated by the SAE signal. Additionally, the bit decoder of FIG. 8B becomes fully self-resetting because transistor 818 effectively shorts node N6 to the drain of transistor 828.

Operationally, the principal difference between the circuit of FIG. 7 and the circuits of FIGS. 8A and 8B is that, in the circuit of FIG. 7, a minimum pulse width is provided in accordance with the active time required for a read operation to be reliably conducted whereas in FIGS. 8A and 8B, the minimum pulse width is provided in accordance with the shorter time required for a write operation. Transistor 819 is added to assert the precharge immediately after the sense amplifier has been activated. The circuits of FIGS. 8A and 8B principally differ in that the resetting of the precharge occurs earlier in the circuit of FIG. 8A.

The principal difference between the circuit of FIG. 7 and the circuit of FIG. 8A may be appreciated by noting that the dec__n signal is provided directly to the gate of transistor 821 which is serially connected to transistor 820. Transistor 820 receives a delayed dec__n signal (the high state of which triggers reset of the decoder and a low state of which indicates reset of the the decoder has been completed; either or both of which are referred to as an output reset signal) through a two inverter stage delay C20 (but which could be provided by any delay structure). This serial connection provides an AND function and thus requires that the dec__n signal be of a predetermined minimum duration established by the delay of C20 before precharging can be started. The dec__n signal is also applied to the gate of low conductivity transistor 817 which pulls node N18 to the power supply voltage to terminate the precharge operation when dec__n switches low, indicating that the precharge operation has been completed.

The circuit shown in box C11 also provides for latching of the SAE signal when it is applied to transistor 827 which is serially connected to transistor 826 which receives a pcn pulse for resetting the latch formed by transistors 822–825. This circuit then operates in the following manner.

Assuming that dec__n has been high for a period determined principally by C20, as discussed above, the onset of the SAE signal will cause node N18 to be pulled down and begin a precharge. To accomplish this, the SAE signal is applied to both transistors 827 and 819, the latter being connected in series with transistor 817 (which is off when dec n is high) and serially connected transistors 820 and 821 which are rendered conductive by the dec__n and delayed dec__n signals. Node N16 is also pulled down in response to the SAE signal and applied to an inverter preferably formed by serially connected transistors 822 and 823 to pull up node N17 and turn on transistor 818 which is connected in parallel with transistor 819. Thus a first read operation is gated by the SAE signal.

The signal on N17 is also fed back to another inverter preferably formed of transistors 824 and 825 to latch the SAE signal until application of a pcn pulse to transistor 826 causes the circuit of C11 to be reset after the end of a cycle in which both read and write operations can be carried out. More specifically, the active SAE signal is cleared from the bit decoder at the beginning of the cycle by application of the pcn signal to transistor 826 to pull node N16 high. The latch formed by transistors 824 and 825 can be a weak latch and the action of transistor 826 overcomes the latching function of transistor 825 in much the same way that transistor 704 overcomes the latching function of transistor 706, described above.

Thus two periods are established during which different memory operations can be performed in each memory cycle. It is also important to the full realization of the advantages of the invention that the period for the second operation is determined by the delay in C20 and can be made shorter than the first period which is gated by the SAE signal. Since write operations take less time than read operations (during which a differential voltage must be allowed to build up on the bit lines) shortest overall cycle times will be achieved by adjusting the first and second time periods to be unequal and closely matched to the operations to be carried out in the respective periods. (The manner in which the precharge is accomplished can also be applied to the word line decoder.)

Figure 9:
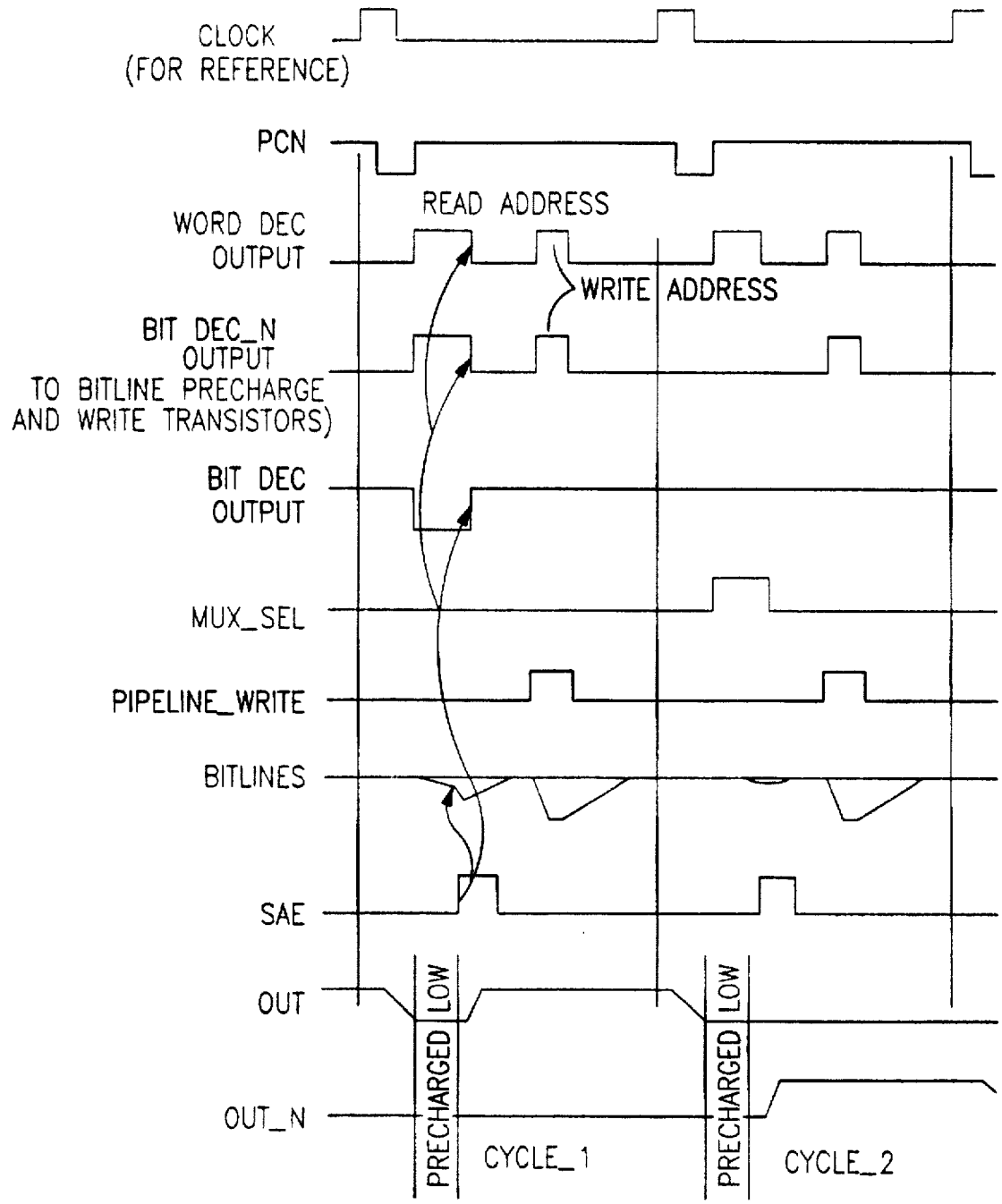
FIG. 9 is a timing diagram illustrating the operation of the invention to provide single cycle read and write operations.

More specifically and with reference to FIG. 9, it is seen that the latching of the SAE signal and the turning on of transistors 818 and 819 disables the bit decoder outputs by executing a precharge operation, as indicated by the curved arrows therein. The duration of this first precharge operation, corresponding to a read, is controlled by the delay corresponding to the propagation time of the SAE signal through the decoder precharge network. The second (e.g. write) operation is controlled in duration principally by the delay of C20. Therefore, this second period can be made as short as may be consistent with the write memory operation. This uneven precharge contributes to the production of the shortest overall memory cycle times consistent with the pipelining of plural memory operations in the same memory cycle period.

Incidentally, it is preferred that only two operations be pipelined in the same memory cycle in view of the very short processor cycle times currently available. However, the principles of the invention described herein could be extended to greater numbers of operations, if desired. It is also important to note from FIG. 9 that the bit decoder output to the sense amplifier can be suppressed by the mux__sel signal in any or all of the operations which are carried out in any given memory cycle period while a bit decoder output can be provided to other bit line switching transistors 1–8, as may be desired. In the preferred embodiment, therefore, independent read and write decoders should be provided for the single cycle read and write function. The read bit decoder is disabled by an active pipelined__write signal.

Another embodiment of the bit decoder circuit is shown in FIG. 8B. The basic difference of this embodiment from that of FIG. 8A is the omission of transistor 21 and the provision of the delayed dec__n signal at node N3 to both transistors 17 and 20. As with the circuit of FIG. 8A, this delay is shorter than the delay to the onset of the SAE pulse and the enablement of the precharge operation to be gated by SAE will have been accomplished prior to the leading edge of the SAE pulse. In other words, in the embodiment of FIG. 8B, the SAE signal gates the reset during the read portion of the cycle, as in the embodiment of FIG. 8A but occurs more quickly because of the smaller transistor stack. However, the embodiment of FIG. 8A provides more rapid termination of precharge by bypassing C20.

The improved cycle time provided by the circuit of FIG. 8B derives from the omission of transistor 821 which has been found to slow the gating of the precharging signal by the SAE signal because of the increased series resistance.

Figure 10:
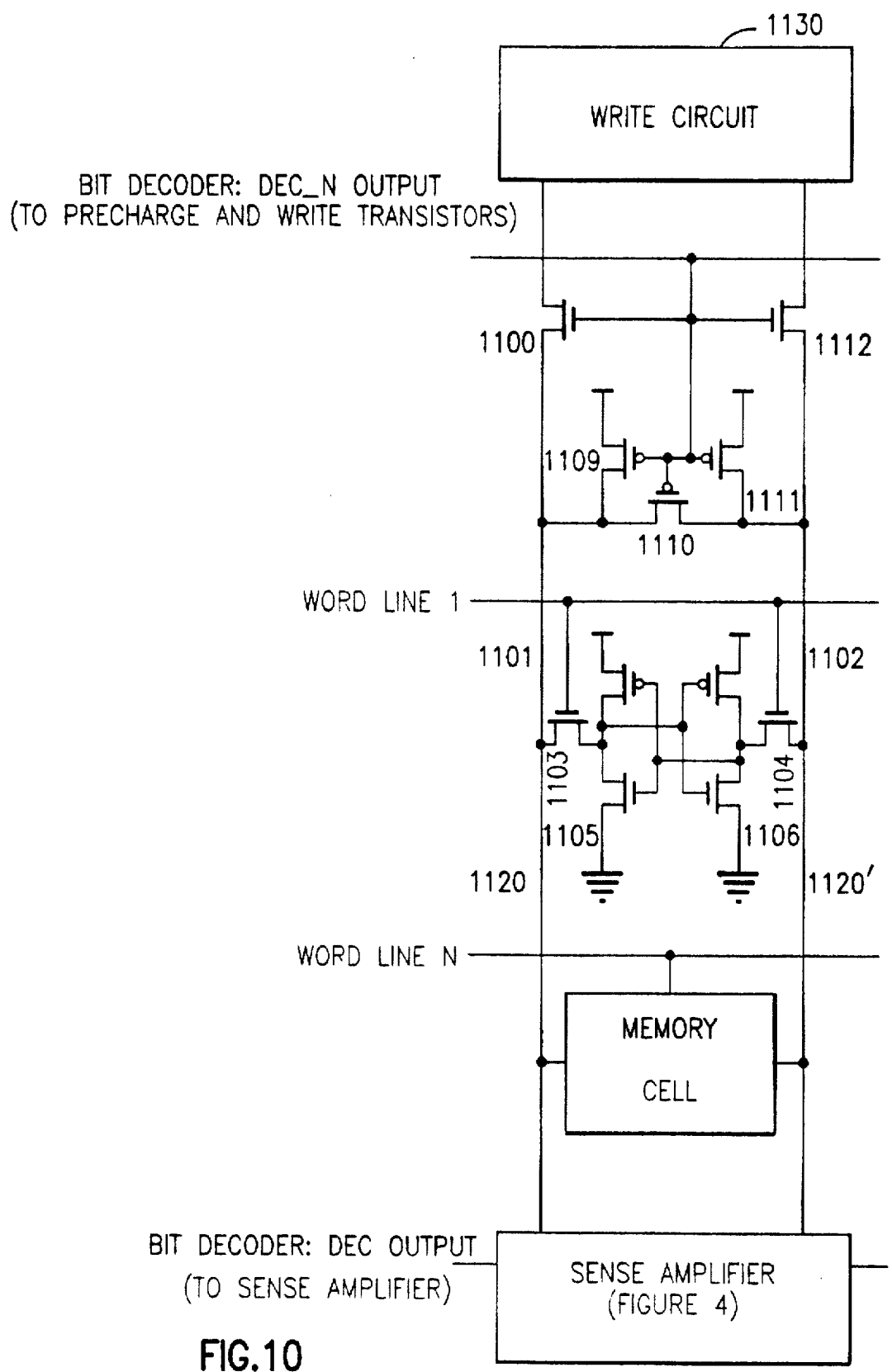
FIG. 10 is a simplified schematic diagram showing a circuit for providing read and write accesses within a single clock cycle.

Referring now to FIG. 10, an exemplary schematic is shown for performing both read and write operations at the same or different addresses during a single memory cycle in accordance with either of the embodiments of FIGS. 8A or 8B. The memory cell array is shown to the extent of two exemplary memory cells respectively connected to word line 1 and word line n, one being shown in detail and comprising transistors 1101–1106. Of course, the form of the memory cell is not important to the practice of the invention. For example, while a static type of cell comprising a bistable circuit is shown, a dynamic charge storage structure including a capacitive cell could also be used. The sense amplifier of FIG. 4 is shown connected to representative bit lines 1120 and 1120. The sense amplifier also receives inputs from the bit decoder of FIGS. 5, 7, 8A or 8B to control connection of pairs of bit lines to the sense amplifier, as described above. A write circuit 1130 is also connected to the bit lines (in pairs) through transmission gate transistors 1108 and 1112.

Prior to partial selection of a memory cell by application of voltages to a word line, the voltages on the bit lines are equalized by precharging them high through low conductance transistors 1109, 1110 and 1111. The opening of transmission gates preferably formed by transistors 1108 and 1112 (the form of the transmission gates is not critical to the practice of the invention) is done simultaneously with turning off the precharging transistors 1109–1111. It should be noted in this regard that if both the sense amplifier and write circuit are active, a write-through to the sense amplifier can also be done. This operation involves the same bit lines since the write-through is fed through to the sense amplifier.

In view of the foregoing, it is seen that the sense amplifier arrangement and support circuitry in accordance with the invention provides a relatively simple circuit which can be fabricated at very small size and high integration density but yet is capable of operation at very high speed and with the flexibility for inputting signals to the sense amplifier through a multiplexer, latching any signal for an indefinite period of time and allowing pipelining of plural memory operations in a single memory cycle while retaining data (e.g. read from memory or input through the multiplexor at the sense amplifier output. It is also seen that the invention provides a memory using precharged circuits having asymmetrical response speed and noise immunity and capable of directly driving both precharged and static types of logic.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A sense amplifier support circuit including a decoder, means for gating a reset of said decoder, means for precharging said decoder in response to a logic state of an output of said decoder subsequent to a reset of said decoder, and means for simultaneously disabling all outputs of said decoder.

2. A sense amplifier support circuit as recited in claim 1, wherein said means for precharging said decoder includes means responsive to an input signal for causing precharging of said decoder.

3. A sense amplifier support circuit as recited in claim 1, further including means for delaying an output reset signal of said decoder.

4. A sense amplifier support circuit as recited in claim 2, further including means for latching said input signal.

5. A sense amplifier support circuit as recited in claim 2, further including means for delaying an output reset signal of said decoder, and means for latching said input signal.

6. A sense amplifier support circuit as recited in claim 3, wherein said means for precharging said decoder includes means responsive to both said output reset signal of said decoder, and to an output of said means for delaying an output reset signal of said decoder for causing precharging of said decoder.

7. A sense amplifier support circuit as recited in claim 3, wherein said means for precharging said decoder in response to a logic state of an output reset signal of said decoder includes and is responsive to an output of said means for delaying an output reset signal of said decoder.

* * * * *